United States Patent
Yamada et al.

(10) Patent No.: US 8,030,955 B2
(45) Date of Patent: Oct. 4, 2011

(54) PROBE CARD INCLINATION ADJUSTING METHOD, INCLINATION DETECTING METHOD AND STORAGE MEDIUM STORING A PROGRAM FOR PERFORMING THE INCLINATION DETECTING METHOD

(75) Inventors: Hiroshi Yamada, Nirasaki (JP); Tetsuji Watanabe, Nirasaki (JP); Takeshi Kawaji, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 284 days.

(21) Appl. No.: 12/394,801

(22) Filed: Feb. 27, 2009

(65) Prior Publication Data
US 2009/0219046 A1 Sep. 3, 2009

(30) Foreign Application Priority Data
Feb. 28, 2008 (JP) .................. 2008-047691

(51) Int. Cl.
*G01R 31/00* (2006.01)
(52) U.S. Cl. .......... 324/750.16; 324/754.01; 324/754.11
(58) Field of Classification Search ........................ None
See application file for complete search history.

(56) References Cited

U.S. PATENT DOCUMENTS

| | | | | |
|---|---|---|---|---|
| 5,644,245 A * | 7/1997 | Saitoh et al. | ............. | 324/750.18 |
| 7,772,862 B2 * | 8/2010 | Yamada et al. | ............. | 324/754.01 |
| 7,839,156 B2 * | 11/2010 | Yamada et al. | ............. | 324/750.25 |

FOREIGN PATENT DOCUMENTS

| | | |
|---|---|---|
| JP | 7-231018 | 8/1995 |
| JP | 2005-140662 | 6/2005 |
| JP | 2007-0029572 | 3/2007 |
| JP | 02009164298 A * | 7/2009 |

OTHER PUBLICATIONS

Office Action issued Dec. 20, 2010 in Korean Patent Application No. 10-2009-0016483 (with English translation).

* cited by examiner

*Primary Examiner* — Vinh Nguyen
(74) *Attorney, Agent, or Firm* — Oblon, Spivak, McClelland, Maier & Neustadt, L.L.P.

(57) ABSTRACT

An inclination adjusting method adjusts an inclination of a probe card installed at a probe apparatus to make the probe card be in parallel with a mounting surface of a movable mounting table for mounting thereon an object to be inspected. The method includes: detecting an average tip height of multiple probes disposed at each of plural locations of the probe card by using a tip position detecting device; obtaining an inclination of the probe card with respect to the mounting table based on differences in the average tip heights detected from the plural locations of the probe card; and adjusting the inclination of the probe card based on the obtained inclination.

13 Claims, 6 Drawing Sheets

FIG.4A
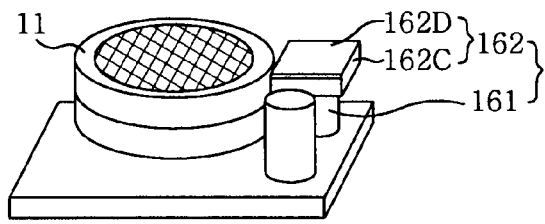
FIG.4B
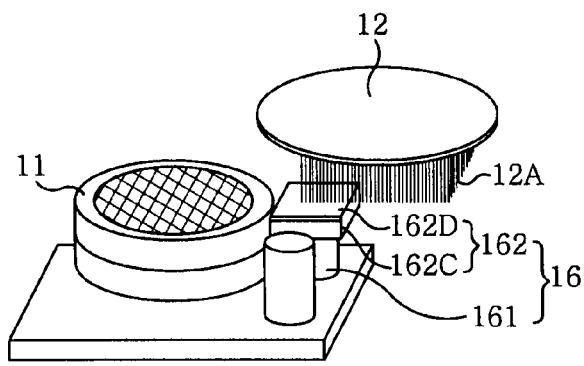
FIG.4C
LEVEL CONTROL
FIG.4D
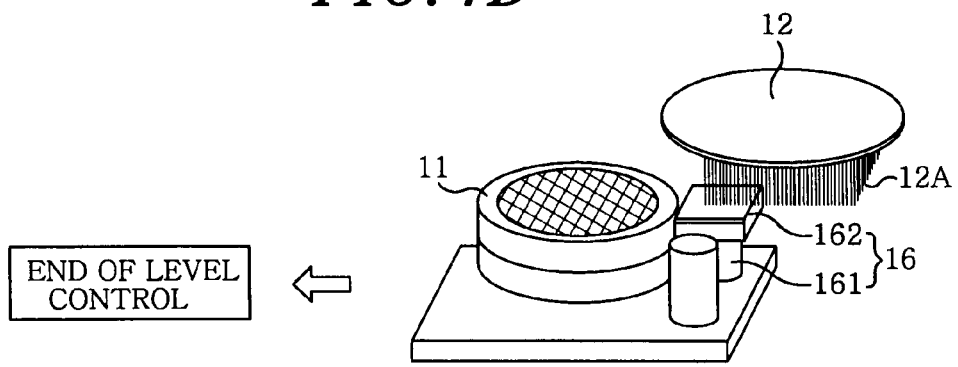
END OF LEVEL CONTROL

FIG.5A
(PRIOR ART)
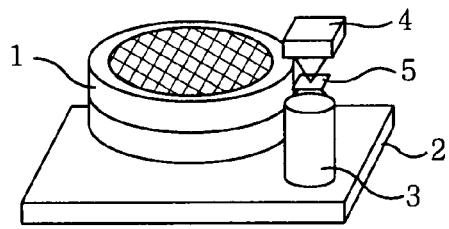
FIG.5B
(PRIOR ART)
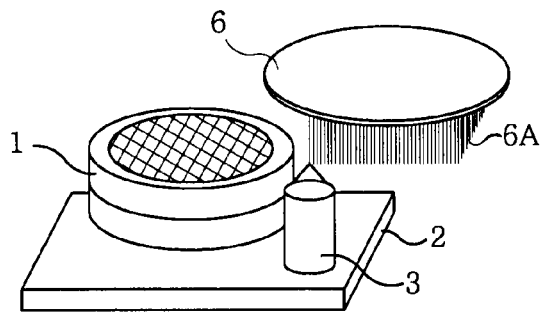
FIG.5C
(PRIOR ART)
LEVEL CONTROL
FIG.5D
(PRIOR ART)
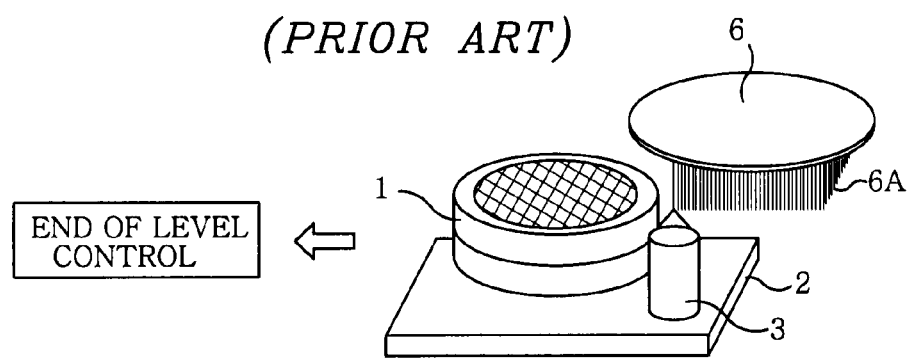
END OF LEVEL CONTROL

PROBE CARD INCLINATION ADJUSTING METHOD, INCLINATION DETECTING METHOD AND STORAGE MEDIUM STORING A PROGRAM FOR PERFORMING THE INCLINATION DETECTING METHOD

FIELD OF THE INVENTION

The present invention relates to a probe card inclination adjusting and detecting method and a storage medium storing a program for performing the inclination detecting method, wherein the inclination detecting method is performed to ensurely make a whole contact between a plurality of probes and an object to be inspected by adjusting an inclination of a probe card installed at a probe apparatus when electrical characteristics of the object to be inspected are inspected by making a whole electrical contact between the probes of the probe card and the object to be inspected such as a semiconductor wafer or the like, an inclination detecting method for a probe card.

BACKGROUND OF THE INVENTION

As for a technique for adjusting an inclination of a probe card, there is known, e.g., an adjusting mechanism for a probe card which is suggested in Patent Document 1 by the applicant of the present invention. In this technique, when electrical characteristics of an object to be inspected such as a semiconductor wafer W or the like are inspected by using a plurality of probes, needle tips of the probes provided at the probe card are imaged in several locations by using a camera, and heights of tip positions of the probes are detected. Based on the difference in the tip heights of the probes, the inclination of the probe card is obtained and, then, the inclination of the probe card is adjusted.

As a pre-processing for detecting the tip heights of the probes by using the camera, coordinates of a reference position of a wafer chuck 1 are obtained by moving the wafer chuck 1 via an XY table 2 and aligning a focus of a second camera 4 that has reached a probe center and a focus of a first camera 3 attached to the wafer chuck 1 with a target 5 attached to the wafer chuck 1, as shown in, e.g., FIG. 5A.

Next, the wafer chuck 1 moves from the reference position to a position below a probe card 6. As illustrated in FIG. 5B, the focus of the first camera 3 is aligned with a tip of a specific probe 6A of the probe card 6, thereby obtaining XYZ coordinates of a height of a tip position of the corresponding probe 6A. Then, the wafer chuck 1 moves to, e.g., three different locations, and the heights of tip positions of the probes 6A in the respective locations are obtained.

If the tip heights of the probes 6A are the same in four locations, it means that the probe card 6 has been levelly disposed so that the probe card 6 can be used for inspection without inclination adjustment. However, if the tip heights of the probes 6A are not the same in the four locations, the probe card 6 is made to be at a level with the mounting surface of the wafer chuck 1 by adjusting the inclination of the probe card 6 (level adjustment) based on the height differences, as can be seen from FIG. 5C. After the inclination of the probe card 6 is adjusted, as depicted in FIG. 5D, the tip heights of the probes 6A of the probe card 6 in the four locations are obtained, thus checking whether or not there exists height difference. When the height difference exists, the inclination of the probe card 6 is adjusted based on the height difference (see FIG. 5C). When all of the probes 6A become at a level with the wafer chuck 1, the level adjustment of the probe card 6 is completed.

[Patent Document 1] Japanese Patent Laid-open Application No. 2005-140662

Since, however, the probe card 6 is provided with a plurality of probes 6A, the tip heights of the probes 6A are not necessarily the same. Namely, the probes 6A have variation in the heights of the tip positions thereof. For that reason, when the heights of tip positions of several representative probes 6A (e.g., four probes in four corners) are detected by using the first camera 3, the variation in the heights of the tip positions thereof affects the detection and, also, the height may be miscalculated due to residues of aluminum adhered to the needle tips, which adversely affects the adjustment of the probe card 6. Further, when the heights of the needle tip positions of the probes 6A are detected by using the first camera 3, a long period of time is required to align the focus of the camera with the needle tip of the probes 6A.

SUMMARY OF THE INVENTION

In view of the above, the present invention provides a probe card inclination adjusting method a probe card which can quickly adjust an inclination of a probe card without being affected by variation in heights of tip positions of the probes. In addition, the present invention provides a probe card inclination detecting method and a storage medium storing a program for performing the inclination detecting method.

In accordance with a first aspect of the present invention there is provided a inclination adjusting method which adjusts an inclination of a probe card installed at a probe apparatus to make the probe card be in parallel with a mounting surface of a movable mounting table for mounting thereon an object to be inspected.

The method includes detecting an average tip height of multiple probes disposed at each of plural locations of the probe card by using a tip position detecting device; obtaining an inclination of the probe card with respect to the mounting table based on differences in the average tip heights detected from the plural locations of the probe card; and adjusting the inclination of the probe card based on the obtained inclination.

The plural locations are preferably spaced apart from each other.

The tip position detecting device may include a sensor unit which is provided at the mounting table and servers to detect the average tip height and a movable contact.

Further, said detecting includes: bringing the contact body into contact with tips of the multiple probes by moving the tip position detecting device via the mounting table; moving the contact body toward the sensor unit by further moving the mounting table; and detecting a movement starting position of the contact body as the average tip height of the probes.

The inclination adjusting method may further include repeating said detecting and said obtaining.

In accordance with a second aspect of the present invention there is provided an inclination adjusting method which adjusts an inclination of a probe card installed at a probe apparatus to make the probe card be in parallel with a mounting surface of a movable mounting table for mounting thereon an object to be inspected.

The method includes: detecting an average tip height of multiple probes disposed at each of plural locations of the probe card by using a tip position detecting device; and obtaining differences in the average tip heights detected from the plural locations of the probe card.

The plural locations are preferably spaced apart from each other.

The tip position detecting device may include a sensor unit which is provided at the mounting table and servers to detect the average tip height and a movable contact.

Further, said detecting includes: bringing the contact body into contact with tips of the multiple probes by moving the tip position detecting device via the mounting table; moving the contact body toward the sensor unit by further moving the mounting table; and detecting a movement starting position of the contact body as the average tip height of the probes.

In accordance with a second aspect of the present invention there is provided a storage medium storing therein a program for performing an inclination detecting method which is performed to make the probe card installed at a probe apparatus be in parallel with a mounting surface of the mounting table for mounting thereon an object to be inspected.

The program includes the steps of: detecting an average tip height of multiple probes disposed at each of plural locations of the probe card by using a tip position detecting device; and obtaining differences in the average tip heights detected from the plural locations of the probe card.

The plural locations are preferably spaced apart from each other.

The tip position detecting device may include a sensor unit which is provided at the mounting table and servers to detect the average tip height and a movable contact.

Further, said detecting includes: bringing the contact body into contact with tips of the multiple probes by moving the tip position detecting device via the mounting table; moving the contact body toward the sensor unit by further moving the mounting table; and detecting a movement starting position of the contact body as the average tip height of the probe.

In accordance with the present invention, there can be provided an inclination adjusting method for a probe card which can quickly adjust an inclination of a probe card without being affected by variation in heights of tip positions of the probes. In addition, the present invention can provide an inclination detecting method for a probe card and a storage medium for performing the inclination detecting method for a probe.

BRIEF DESCRIPTION OF THE DRAWINGS

The objects and features of the present invention will become apparent from the following description of embodiments, given in conjunction with the accompanying drawings, in which:

FIGS. 4A to 4D present views showing the embodiment of an inclination detecting method for a probe card a probe card of the present invention;and FIGS. 5A to 5D offer views illustrating processes of a conventional method for adjusting an inclination of a probe card.

DETAILED DESCRIPTION OF THE EMBODIMENT

Hereinafter, the present invention will be described with reference to the accompanying drawings which form a part hereof. Reference will be made first FIGS. 1 to 4C.

Figure 1:
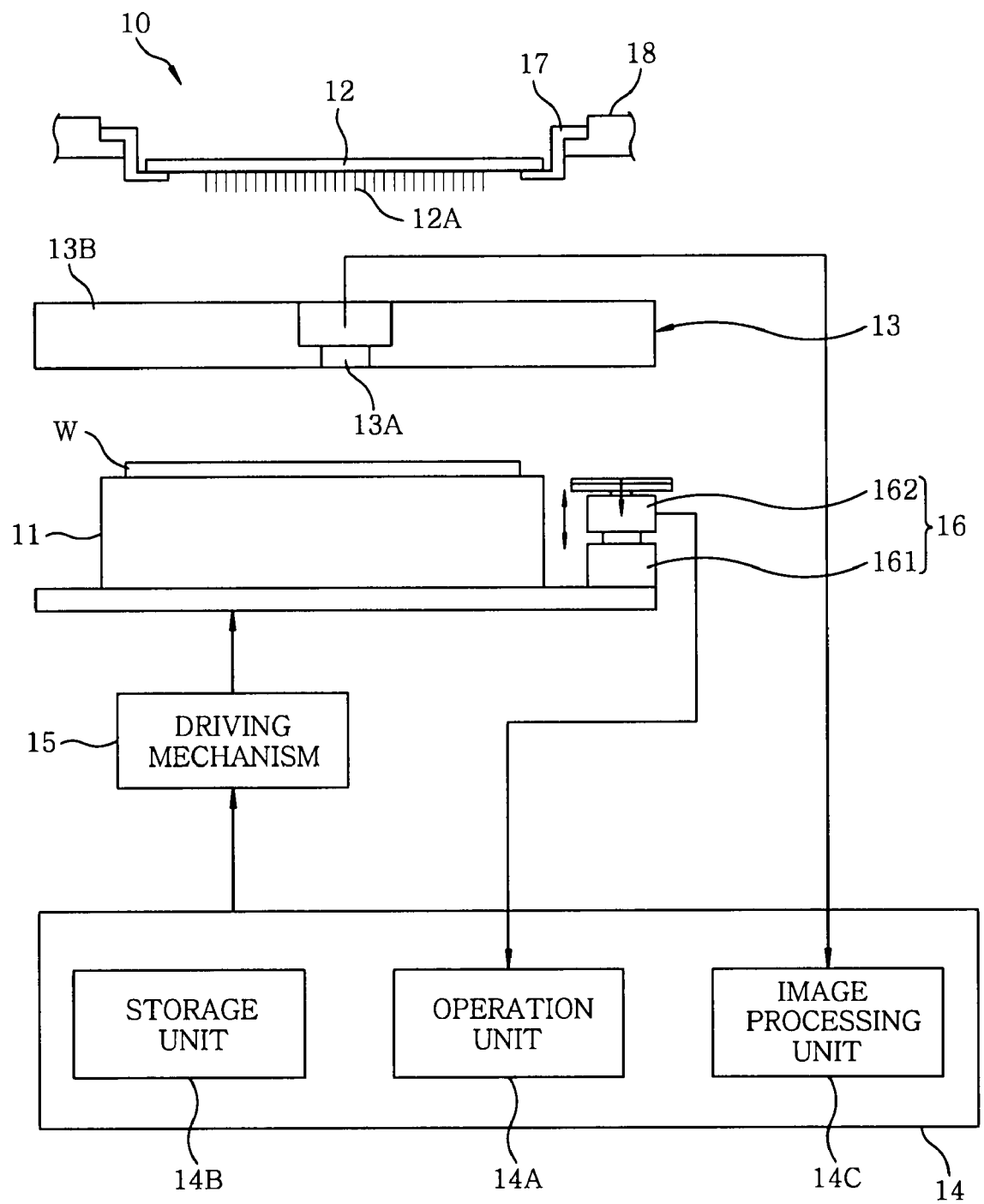
FIG. 1 shows a probe apparatus to which an embodiment of an inclination adjusting method for a probe card of the present invention is applied.

Above all, a probe apparatus to which the inclination adjusting method for a probe card of the present invention is applied will be described with reference to, e.g., FIG. 1. As shown in FIG. 1, the probe apparatus 10 includes a movable wafer chuck 11 for mounting a semiconductor wafer W to be inspected thereon, a probe card 12 arranged above the wafer chuck 11, an alignment mechanism 13 for aligning a plurality of probes 12A of the probe card 12 with the semiconductor wafer W mounted on the wafer chuck 11, and a control unit (computer) 14 for controlling the wafer chuck 11, the alignment mechanism 13 and the like. Under the control of the control unit 14, the alignment mechanism 13 is driven to align the semiconductor wafer W mounted on the wafer chuck 11 and the probes 12A of the probe card 12. Subsequently, electrical characteristics inspection of the semiconductor wafer W is conducted by brining the probes 12A into whole electrical contact with electrode pads of the semiconductor wafer W corresponding to the probes 12A.

The wafer chuck 11 is configured to move in X, Y, Z and θ directions by means of a driving mechanism 15 operated under the control of the control unit 14. A tip position detecting device 16 is arranged at a peripheral portion of the wafer chuck 11. The tip positions of the probes 12A are detected as three-dimensional coordinates by the tip position detecting device 16, so that the tip position detecting device 16 is used for the inclination adjusting method for a probe card and the inclination detecting method for a probe card of the present invention, as will be described later.

The probe card 12 is attached to a head plate 18 of a probe chamber via a card holder 17 so that an inclination thereof can be adjusted. As shown FIGS. 1 and 4, the probe card 12 has probes 12A to make a whole contact with testing electrode pads of all of devices D formed on the semiconductor wafer W. The electrical characteristics of the semiconductor wafer W are inspected based on a signal from a tester (not shown) by bringing the probes 12A into electrical contact with the testing electrode pads formed on all of the devices of the semiconductor wafer W in a state where they are in parallel with the mounting surface of the semiconductor wafer W of the wafer chuck 11. Although the mechanism for adjusting the inclination of the probe card 12 is not particularly limited, there may be employed, e.g., an adjusting mechanism for a probe card, which is suggested in Japanese Patent Laid-open Application No. 2005-140662 by the applicant of the present invention, and illustrated in FIGS. 6A and 6B.

Further, as illustrated in FIG. 1, the alignment mechanism 13 includes an imaging unit (CCD camera) 13A and an alignment bridge 13B for supporting the CCD camera 13a, the alignment bridge 13B being movable in on direction. Under the control of the control unit 14, the CCD camera 13a moves from a wait position to a position just below the center of the probe card 12 (hereinafter referred to as a "probe center") by means of the alignment bridge 13B. Then, the CCD camera 13A is stopped at that position. While the wafer chuck 11 is moved in the X and Y directions during an alignment process, the CCD camera 13A positioned at the probe center takes an image of the electrode pads of the semiconductor wafer W supported on the wafer chuck 11 from the top thereof. The taken image is processed in an image processing unit 14c and displayed on a display screen (not shown). As will be described later, the CCD camera 13A takes an image of the tip position detecting device 16 annexed to the wafer chuck 11. The image thus taken is processed and displayed on the display screen.

Moreover, as depicted in FIG. 1, the control unit 14 includes an operation unit 14A, a storage unit 14B, and the aforementioned image processing unit 14C. The probe device 10 is controlled by various programs stored in the storage unit 14B. Thus, the storage unit 14B stores therein the programs for performing the inclination adjusting method for a probe card and the inclination detecting method for a probe card in accordance with the embodiment of the present invention. These methods are executed by the programs read from the storage unit 14B, and various data obtained as a result of the execution are stored in the storage unit 14B.

Figure 2:
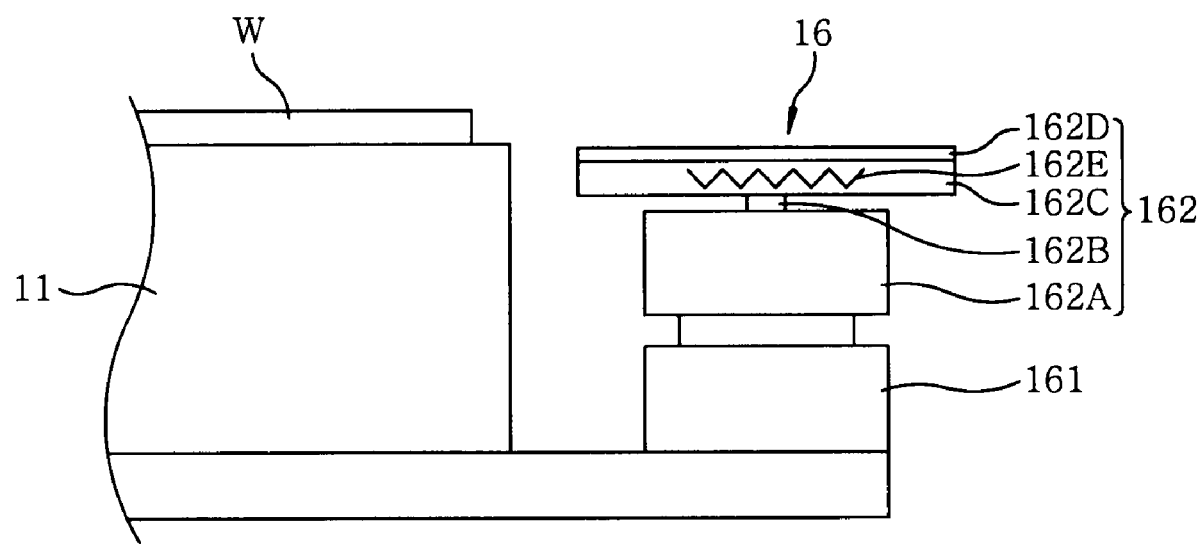
FIG. 2 is a side view illustrating a tip position detecting device used in the probe apparatus of FIG. 1.

Referring to FIGS. 1 and 2, the tip position detecting device 16 in accordance with the embodiment of the present invention includes an elevation driving mechanism 161 such as an air cylinder or the like and a sensor mechanism 162 moved up and down by the elevation driving mechanism 161. When detecting the tip positions of the probes 12A, the elevation driving mechanism 161 raises up the sensor mechanism 162 from the wait position to a height substantially flush with the top surface of the semiconductor wafer W supported on the wafer chuck 11.

For example, as shown in FIG. 2, the sensor mechanism 162 includes a sensor unit 162A including a cylinder mechanism and serving as a displacement sensor; a contact body 162C attached to the top end of a piston rod 162B included in the cylinder mechanism of the sensor unit 162A and kept in a position raised from the sensor unit 162A; an elastic resin sheet 164D detachably attached to the top surface of the contact body 162C; and a pressure applying unit (not shown), such as a compressed air source or the like, for supplying a compressed air into a cylinder included in the sensor unit 162a to apply a specified pressure to the contact body 162C through a piston (not shown) received in the cylinder.

Further, as shown in FIG. 2, e.g., a heater 162E is provided in the contact body 162c. The heater 162E is designed to heat the resin sheet 162D, thereby eliminating the probe marks of the probes 12A transferred to the resin sheet 162d. This makes it possible to use the resin sheet 162D repeatedly.

A fixing plate (not shown) is attached to the bottom end of the piston rod 162B. Through the fixing plate, the contact body 162C is resiliently held by the sensor unit 162A at all times in a raised position spaced apart from the sensor unit 162A at a predetermined distance. The gap left between the contact body 162C and the sensor unit 162A becomes a movable range of the contact body 162C. The distance of the gap is detected by the sensor unit 162A, whereby the position of the contact body 162C is monitored at all times by the sensor unit 162a.

The pressure applying unit is designed to switch over a first and a second pressure. The first pressure denotes a pressure which is set when detecting the tip positions of the probes 12A. The first pressure is set smaller than the second pressure. The second pressure refers to a pressure which is set when transferring the probe marks of the probes 12A to the top surface of the resin sheet 162D during an alignment process.

The sensor unit 162A is provided with a pressure regulating unit (not shown), such as a constant-pressure valve or the like, for keeping the first or second pressure constant. When the contact body 162C is moved down toward the sensor unit 162A, the pressure regulating unit gradually discharges the pressurized air to thereby keep the first pressure constant.

In a state that the contact body 162C is kept in place by the first pressure, the tip position detecting device 16 is raised up through the movement of the wafer chuck 11, whereby the contact body 162C makes contact with the probes 12A via the resin sheet 162D. At this time, the contact body 162C is moved down toward the sensor unit 162A without changing the initial tip positions despite the contact with the contact body 162C. In the state that the contact body 162C is kept in place by the first pressure, the probes 12A imparts a force of, e.g., 0.5 gf per probe, on the resin sheet 162D.

When the probes 12 arranged in two dimensions make contact with the resin sheet 16D at a time by the first pressure, the tip heights of the probes 12A are detected simultaneously. Therefore, the average height of the probes 12A in contact with the resin sheet 162D is detected. That is, the probes 12A include ones that are slightly bent due to the contact with the resin sheet 162D, ones that are not bent despite the contact therewith, and ones that are not in contact therewith. The resin sheet 162D is made of a material having a hardness great enough to ensure that the resin sheet 162D is kept free from damage even when the probes 12A make contact with the resin sheet 162D while the first pressure is applied to the contact body 162C. As the material for forming the soft member 162D, it is preferable to use shape memory resin or thermoplastic resin such as PO, PVC or the like.

In a state that the contact body 162C is kept at the second pressure, the contact body 162C is not moved down toward the sensor unit 162A but maintained in the initial position even if the probe pressure is applied to the resin sheet 162D by the probes 12A. Therefore, the probes 12A transfers probe marks to the top surface of the resin sheet 162D.

Hereinafter, an inclination adjusting method for a probe card and an inclination detecting method for a probe card which is applied to the inclination adjusting method for a probe card in accordance with the present embodiment will be described with reference to FIGS. 3A to 4D.

The inclination adjusting method for a probe card and the inclination detecting method for a probe card of the present embodiment are implemented by the programs driven by the control unit 14 in order to make the mounting surface of the wafer chuck 11 to be in parallel with the probe card 12 installed at the probe apparatus 10. By performing these methods, all of the probes 12A of the probe card 12 can be brought into whole contact with the testing electrode pads of all of the devices D of the semiconductor wafer W. Hence, a highly reliable inspection can be carried out. When the tip heights of the probes 12A are detected by using the tip position detecting device 16, the sensor mechanism 162 is set at a first pressure.

First of all, a card holder 17 is attached to the head plate 18 of the probe apparatus 10 via the card holder 17. In this step, the inclination between the probe card 12 and the wafer chuck 11 has not been adjusted. Therefore, the wafer chuck 11 moves in a horizontal direction, and the tip heights of the probes 12A of the probe card 12 are detected at a plurality of locations, which are spaced apart from each other without being overlapped, by using the tip position detecting device 16. In the present embodiment, the probes 12A are arranged in a substantially rectangular shape, so that the tip heights of multiple probes 12A disposed at each of, e.g., four corners are detected simultaneously. The detected values are stored in the storage unit 14A of the control unit 14. If the tip heights of the probes 12A at a plurality of locations are substantially the same, the probe card 11 becomes substantially in parallel with the top surface of the wafer chuck 15. Accordingly, the inspection of the wafer W is performed without adjusting the inclination of the probe card 11. Since, however, it hardly occurs in normal circumstances, the inclination of the probe card 12 is adjusted.

In order to detect the tip heights of the probes 12A of the probe card 12, first, the height of the top surface of the contact body 162C of the tip position detecting device, i.e., the height of the top surface of the resin sheet 162D, is detected. To do this, the CCD camera 13A of the alignment mechanism 13 moves to a probe center, i.e., a position directly below the center of the probe card 12, via the alignment bridge 13B. Next, while the wafer chuck 11 is moving below the alignment bridge 13B, the tip position detecting device 16 raises up the sensor mechanism 162 from a wait position shown in FIG. 3A via the elevation driving mechanism 161, as indicated by an arrow shown in FIG. 3B. Further, the top surface of the resin sheet 162D on the contact body 162C is set to be slightly higher than the top surface of the semiconductor wafer W on the wafer chuck 11.

Figure 3A:
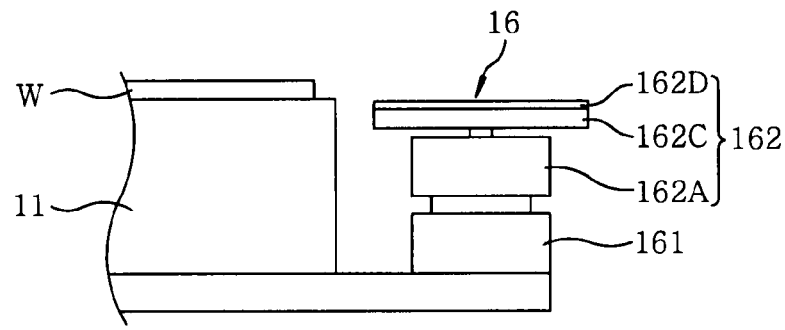
FIGS. 3A to 3C provide views describing processes of detecting a height of a probe contact body of the tip position detecting device.
Figure 3B:
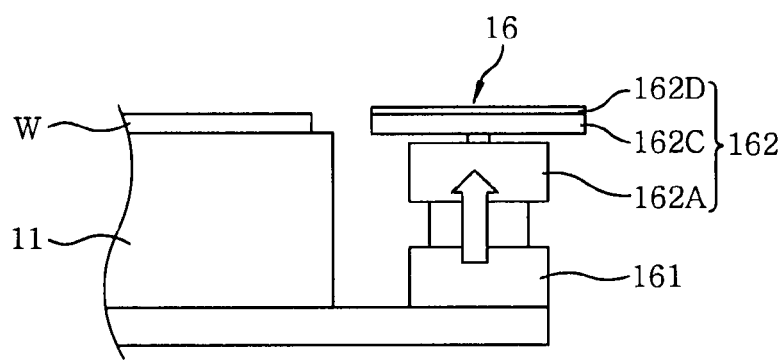
Figure 3C:
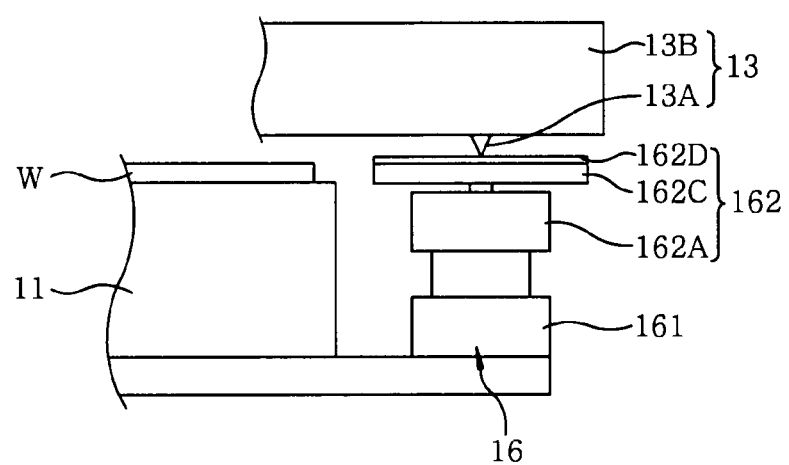

Thereafter, the wafer chuck 11 moves in X and Y directions, and the contact body 162C reaches a position directly below the CCD camera 13A, as shown in FIG. 3C. Then, the wafer chuck 11 is gradually raised up via the driving mechanism 15 to be aligned with the focus of the CCD camera 13A. The coordinate position of the wafer chuck 11 at this time becomes a reference position for use in detecting the tip heights of the probes 12A. In this manner, the height of the top surface of the resin sheet 162D is obtained based on the Z coordinate value obtained when the wafer chuck 11 is in the reference position.

After the height of the top surface of the resin sheet 162D is obtained, the operation of the sensor mechanism 162 of the tip position detecting device 16 is checked in the step described in FIG. 4A. Namely, basic conditions such as the downward movement of the contact body 162C which is required to detect height of tip positions, the hardness of the resin sheet 162 and the like are checked. If the operation of the tip position detecting device 16 is checked to be normal, the detection of the tip heights of the probes 12A is carried out.

In order to detect the tip heights of the probes 12A, the alignment bridge 13B is retracted to the wait position. Next, in a state where the tip position detecting device 16 is set at the first pressure, the wafer chuck 11 moves in X and Y directions to position the contact body 162C of the tip position detecting device 16 directly below one of four corners where the probes 12A of the probe card 12 are disposed. At this position, the wafer chuck 11 is gradually raised from the Z-direction reference position, and the resin sheet 162D of the tip position detecting device 16 comes close to the probes 12A to makes contact therewith, as shown in FIG. 4B.

If the wafer chuck 11 further moves up, the contact body 162C is pressed by the probes 12A via the resin sheet 162D and moved down toward the sensor unit 162A. At this time, the contact body 162C is elastically held under the first pressure. Therefore, even if the probe pressure is applied from the probes 12A to the resin sheet 162D, the probes 12A neither stick into the resin sheet 162D nor cause damage to the resin sheet 162D (nor transfer the probe marks to the resin sheet 162D). In other words, as the wafer chuck 11 moves to upwards, the contact body 162C moves down toward the sensor unit 162A by a distance corresponding to the upward movement of the wafer chuck 11 while being maintained at the first pressure, thereby reducing the gap between the sensor unit 162A and the contact body 162C.

At this time, the sensor unit 162A monitors the distance between itself and the contact body 162C. If the gap between the sensor unit 162A and the contact body 162C is changed by the downward movement of the contact body 162C, the sensor unit 162A detects the length of the gap and transmits a detection signal to the control unit 14. Accordingly, the control unit 14 compares the value detected by the sensor unit 162A with an initial gap value preset in the operation unit 14A. Based on the upward movement distance from the reference position of the wafer chuck 11 until the moment when the detection value becomes smaller than the initial value, the control unit 14 calculates the height of the top surface of the resin sheet 162D, i.e., the height of the tip positions of the probes 12A, as the average tip height of the probes 12A. The average tip height of the probes 12A thus obtained is stored as Z-coordinate data in the storage unit 14B of the control unit 14. Subsequently, the wafer chuck 11 is returned to reference position of the Z-direction. Next, the wafer chuck 11 moves to three other locations among the four corners where the probes 12A are positioned, and the above-described operations are repeated in the respective locations, thereby obtaining the average tip height of the probes 12A in the respective locations.

Since the probe card 12 has an inclination, the inclination of the probe card 12 is adjusted (level adjustment) in the step of FIG. 4C based on the difference in the average tip heights of the probes 12A in the four corners. The level adjustment can be performed by using the adjusting mechanism of the probe card disclosed in Japanese Patent Laid-open Application No. 2006-317302 by the applicant of the present invention. However, the adjusting mechanism is not limited thereto, and may be another adjusting mechanism.

After the inclination of the probes card 12 is adjusted, the tip position detecting device 16 is raised again via the wafer chuck 11 to be aligned with the probes 12A in four corners, thereby obtaining the average tip height of the probes 12A in that position, as illustrated in FIG. 4D. When the average tip heights of the probes 12A in the four corners are obtained, the level adjustment illustrated in FIG. 4C is performed based on the height difference. After the level adjustment, the inclination of the probe card 12 is checked as shown in FIG. 4D. If the average tip heights of the probes 12A are the same in the four corners, the level adjustment is completed.

After the level adjustment of the probe card 12 is completed, the pressure applied to the contact body 162C is switched over from the first pressure to the second pressure. Even if the wafer chuck 11 is moved up to bring the resin sheet 162D into contact with the probes 12A and is then overdriven, the contact body 162C is maintained under the second pressure and thus stays in its initial position without moving down toward the sensor unit 162A. As a consequence, the probes 12A are stuck into the resin sheet 162D, and probe marks are transcribed to the top surface of the resin sheet 162D as depicted in FIG. 4B. The specific inspection is carried out after the probes are aligned with the testing electrode pads of the semiconductor wafer W based on these probe marks.

As set forth above, in accordance with the present embodiment, when the inclination of the probe card 12 installed at the probe apparatus 10 is adjusted to make the probe card 12 be in parallel with the mounting surface of the movable wafer chuck 11, there are performed a first step of detecting average tip heights of the probes 12A of the probe card 12 in several locations by using a tip position detecting device 16; a second step of obtaining an inclination of the probe card 12 with respect to the wafer chuck 11 based on the difference in the average tip heights of the probes 12A in the several locations; and a third step of adjusting the inclination of the probe card 12 based on the inclination of the probe card 12. Therefore, even if the probes 12 have variation in the tip heights thereof, the tip heights of the probes 12A can be obtained with high accuracy without being affected by the variation. In addition, the inclination of the probe card 12 with respect to the wafer chuck 11 can be adjusted more accurately. Moreover, a highly reliable inspection can be performed by bringing the probes 12A into whole contact with the testing electrode pads of the semiconductor wafer W. Furthermore, unlike in the conventional case, there arises no need to align the focus of the camera with the tips of the probes 12A. Therefore, it is possible to rapidly detect the tip heights and also possible to quickly adjust the inclination of the probe card 12.

Besides, in accordance with the present embodiment, the tip position detecting device 16 is provided at the wafer chuck 11, and includes the sensor unit 162A for detecting the tip positions of the probes 12A and the movable contact body 162C belonging to the sensor unit 162A. The aforementioned first step includes bringing the contact body 162C into contact with needle tips of the probes 12A via the resin sheet 162D by moving the tip position detecting device 16 via the wafer chuck 11; moving the contact body 162C toward the sensor unit 162A by further moving the wafer chuck 11; and detecting a movement starting position of the contact body 162C as an average tip height of the probes 12A. As a result, the average tip height of the probes can be obtained with further increased accuracy.

Figure 6A:
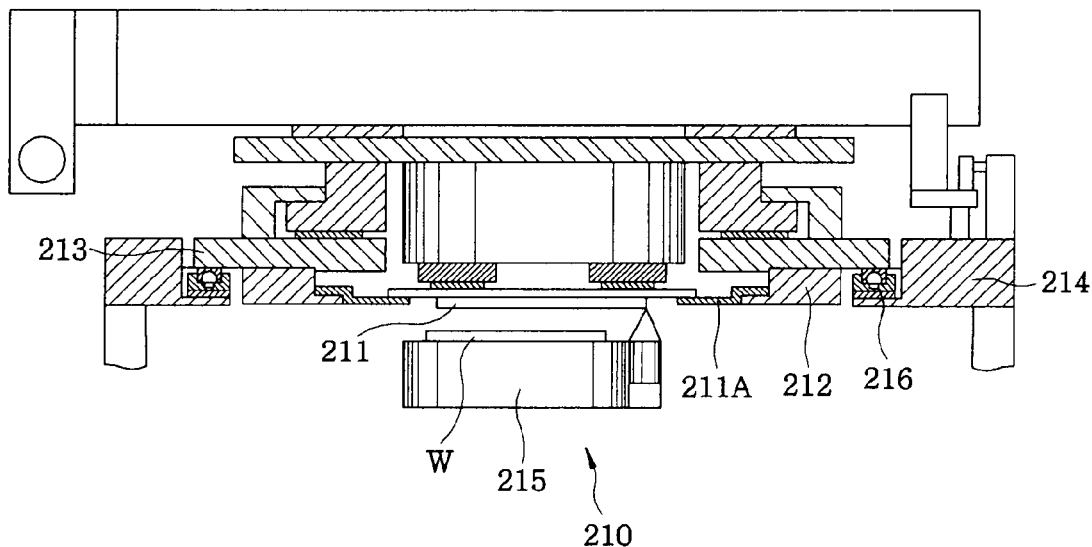
FIGS. 6A and 6B respectively show a sectional view and a top view of a probe device having a mechanism for adjusting the inclination of the probe card.
Figure 6B:
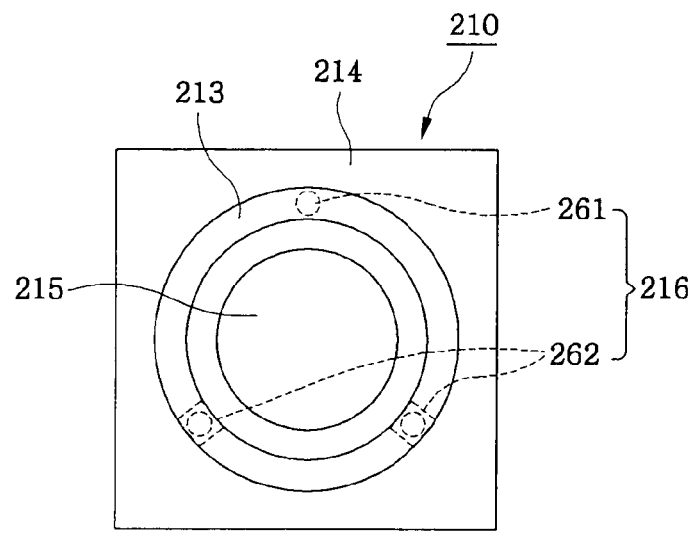

Japanese Patent Laid-open Application No. 2005-140662, as illustrated in FIGS. 6A and 6B, discloses a probe device 210 comprising a card clamp mechanism 212 for fixing a probe card 211 via a card holder 211A, an insert ring 213 for supporting the card clamp mechanism 212, a head plate 214 for supporting the insert ring213, and an adjusting mechanism 216. The adjusting mechanism 216 is interposed between the insert ring 213 and the head plate 214, and has first and second support mechanisms 261, 262 for adjusting a parallelism between the probe card 211 and a wafer W set on a wafer chuck 215. The first support mechanism 261 supports some part of the insert ring 213. The second support mechanism 262, which is estranged from the first support mechanism 261 in a hoop direction, supports the other part of the insert ring 213 and the second support mechanism 262 has a wedge member which is disposed above the head plate 214 and moves the insert ring 213 up and down.

The present invention is not limited to the above embodiment, and the components can be appropriately changed if necessary. For example, in the aforementioned embodiment, as for a contact body for detecting tip heights of probes, there is used one having the resin sheet. However, a sheet made of a hard material such as ceramic or the like other than a resin sheet can also be used for the contact body, or the contact body itself can be used, as long as the tip positions of the probes can be detected. When the contact body having a sheet made of a hard material is employed, an alignment mechanism for a probe may be provided in addition to the tip position detecting device. Further, in the above embodiment, as for a sensor unit for detecting displacement of the contact body, there can be used, e.g., a distance measuring machine such as a capacitance sensor, a laser distance measuring machine or the like. Moreover, the operation of adjusting the inclination of the probe card can be automated.

The present invention is suitable for a probe apparatus for inspecting electrical characteristics of an object to be inspected such as a semiconductor wafer or the like.

While the invention has been shown and described with respect to the embodiments, it will be understood by those skilled in the art that various changes and modification may be made without departing from the scope of the invention as defined in the following claims.

What is claimed is:

1. An inclination adjusting method which adjusts an inclination of a probe card installed at a probe apparatus to make the probe card be in parallel with a mounting surface of a movable mounting table for mounting thereon an object to be inspected, comprising:

detecting a tip height representative of multiple probes disposed at each of plural locations of the probe card by moving a tip position detecting device to each of the plural locations;

obtaining an inclination of the probe card with respect to the mounting table based on differences in the tip heights detected from the plural locations of the probe card; and adjusting the probe apparatus to adjust the inclination of the probe card based on the obtained inclination.

2. The method of claim 1, wherein the plural locations are spaced apart from each other.

3. The method of claim 1, wherein the tip position detecting device includes a sensor unit which is provided at the mounting table to detect the tip height and a movable contact body, and wherein said detecting includes:

bringing the contact body into contact with tips of the multiple probes by moving the tip position detecting device via the mounting table;

moving the contact body toward the sensor unit by further moving the mounting table; and detecting a movement starting position of the contact body as the tip height representative of the multiple probes.

4. The method of claim 1, further comprising repeating said detecting and said obtaining.

5. The method of claim 3, wherein the sensor unit is a capacitance sensor or a laser distance measuring machine.

6. An inclination adjusting method which adjusts an inclination of a probe card installed at a probe apparatus to make the probe card be in parallel with a mounting surface of a movable mounting table for mounting thereon an object to be inspected, comprising:

detecting a tip height representative of multiple probes disposed at each of plural locations of the probe card by moving a tip position detecting device to each of the plural locations; and obtaining differences in the tip heights detected from the plural locations of the probe card.

7. The method of claim 6, wherein the plural locations are spaced apart from each other.

8. The method of claim 6, wherein the tip position detecting device includes a sensor unit which is provided at the mounting table to detect the average tip height and a movable contact body, and wherein said detecting includes:

bringing the contact body into contact with tips of the multiple probes by moving the tip position detecting device via the mounting table;

moving the contact body toward the sensor unit by further moving the mounting table; and detecting a movement starting position of the contact body as the tip height representative of the multiple probes.

9. The method of claim 8, wherein the sensor unit is a capacitance sensor or a laser distance measuring machine.

10. A non-transitory computer-readable storage medium having computer executable instructions stored therein, which when executed by a processer causes the processor to perform an inclination detecting method, which is performed to make a probe card installed at a probe apparatus be in parallel with a mounting surface of a mounting table for mounting thereon an object to be inspected, the method comprises the steps of:

detecting a tip height representative of multiple probes disposed at each of plural locations of the probe card by moving a tip position detecting device to each of the plural locations; and obtaining differences in the tip heights detected from the plural locations of the probe card.

11. The non-transitory computer-readable storage medium of claim 10, wherein the plural locations are spaced apart from each other.

12. The non-transitory computer-readable storage medium of claim 11, wherein the tip position detecting device includes a sensor unit which is provided at the mounting table to detect the average tip height and a movable contact body, and wherein said detecting includes:

bringing the contact body into contact with tips of the multiple probes by moving the tip position detecting device via the mounting table;

moving the contact body toward the sensor unit by further moving the mounting table; and detecting a movement starting position of the contact body as the tip height representative of the multiple probes.

13. The non-transitory computer-readable storage medium of claim 12, wherein the sensor unit is a capacitance sensor or a laser distance measuring machine.

* * * * *